(12) United States Patent
Carballo et al.

(10) Patent No.: US 6,801,025 B2
(45) Date of Patent: Oct. 5, 2004

(54) METHOD AND APPARATUS FOR CONTROL OF VOLTAGE REGULATION

(75) Inventors: Juan-Antonio Carballo, Austin, TX (US); Kevin John Nowka, Round Rock, TX (US); Ivan Vo, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 10/289,815

(22) Filed: Nov. 7, 2002

(65) Prior Publication Data

US 2004/0090216 A1 May 13, 2004

(51) Int. Cl.[7] .............................. G05F 1/10; G11C 8/00
(52) U.S. Cl. ..................................... 323/234; 365/226
(58) Field of Search ................................ 323/234, 268, 323/270, 271, 273, 282, 283; 365/174, 185.18, 185.23, 185.25, 226–229

(56) References Cited

U.S. PATENT DOCUMENTS

| | | | | |
|---|---|---|---|---|
| 4,337,524 A | * | 6/1982 | Parkinson | 365/189.09 |
| 4,460,951 A | | 7/1984 | Fenter et al. | 363/49 |
| 4,757,214 A | | 7/1988 | Kobayashi | 327/172 |
| 4,810,948 A | | 3/1989 | Takuma | 323/280 |
| 5,594,692 A | * | 1/1997 | Yamaguchi | 365/189.09 |
| 5,729,162 A | * | 3/1998 | Rouy | 327/103 |
| 6,222,787 B1 | * | 4/2001 | Yoon et al. | 365/226 |
| 6,415,007 B1 | | 7/2002 | Kawasumi | 375/374 |
| 6,643,200 B2 | * | 11/2003 | Clark et al. | 365/205 |

OTHER PUBLICATIONS

Wei, et al., "A Fully Digital, Energy–Efficient, Adaptive Power–Supply Regulator", IEEE Journal for Solid–State Circuits, vol. 34, No. 4, Apr. 1999, pp. 520–528.

Khourly, et al., "High–Speed Serial Transceivers for Data Communication Systems", IEEE Communications Magazine, Jul. 2001, pp. 160–165.

* cited by examiner

Primary Examiner—Matthew V. Nguyen
(74) Attorney, Agent, or Firm—Casimer K. Salys; Anthony V. S. England

(57) ABSTRACT

According to an apparatus form of the invention, integrated circuitry on a single chip includes a bit-programmable voltage regulator supplying voltage to first circuitry on the chip. The integrated circuitry also includes second circuitry operable for characterizing performance of the first circuitry. Control circuitry on the chip is operable, responsive to the characterizing performed by the second circuitry, to output at least one digital control bit for controlling the regulator output voltage supplying the first circuitry. In another aspect, the integrated circuitry is operable to receive an externally generated, time-based reference signal, and the second circuitry includes an on-chip oscillator for generating a performance characterizing signal. The performance characterizing signal varies in frequency in correspondence with the performance of the first circuitry. The control circuitry receives the reference signal and the performance characterizing signal and responsively generates the at least one control bit.

20 Claims, 4 Drawing Sheets

METHOD AND APPARATUS FOR CONTROL OF VOLTAGE REGULATION

BACKGROUND

1. Field of the Invention

The present invention concerns regulating integrated circuitry supply voltage, and more particularly concerns automatically dynamically controlling supply voltage responsive to performance of the integrated circuitry.

2. Related Art

Integrated high-speed chips are increasingly required to consume very low power. Such a difficult power-bandwidth tradeoff requires design techniques that make the most of each technology generation. Low-power design techniques are thus necessary to reduce power consumption. An effective power-reduction approach is to reduce the chip power supply. Given a certain power supply for a chip, and a need to selectively modify the supply voltage to certain circuitry, one well-known solution is to connect the chip's power supply to an off-chip regulator and connect the voltage output of the regulator to the circuitry on the chip. However, system-level requirements increasingly demand that chips be fully integrated, resulting in so-called systems-on-a-chip (SOC's). These system requirements tend to demand compatibility with standard technologies, but with no additional external power supplies. For example, it may be desirable for an SOC to operate from a single external power supply, but at the same time to operate a processor core on the SOC at a lower voltage than that which is supplied to the chip. This makes it difficult to integrate cores that work at lower voltages.

Besides selectively reducing voltage to reduce power consumption, it is also known to automatically raise regulator output voltage to compensate for performance degradation. However, conventional methods and structures for automatic control of voltage regulation tend to be complicated, so that the control circuitry consumes more power and takes up more area on the chip. Also, as in the above described voltage reduction applications, voltage boosting applications likewise generally use an off-chip, switching-type regulator. Moreover, these past arrangements also tend to require nonstandard technologies, such as bipolar transistors. See, for example, Gu-Yeon Wei and Mark Horowitz, "A Fully Digital, Energy-Efficient, Adaptive Power-Supply Regulator," IEEE Journal of Solid-state Circuits, Vol. 34, No. 4 April, 1999, pages 520–528.

SUMMARY

As indicated in the above brief explanation, a need exists for improvements in regulating integrated circuitry supply voltage for both selective voltage reduction and voltage boosting applications. This need is addressed in the present invention. According to an apparatus form of the invention, integrated circuitry on a single chip includes, a bit-programmable voltage regulator, circuitry for performing a processing function, and control circuitry operable to monitor an indication of performance of the circuitry and responsively output at least one control bit for controlling the regulator output voltage.

In an another aspect, the integrated circuitry is operable to receive an externally generated, time-based reference signal, and the integrated circuitry includes an on-chip oscillator for generating a time-based, oscillator output signal. The oscillator output signal varies in correspondence with the performance of the circuitry, which provides the above mentioned performance indication. The control circuitry receives the reference and oscillator output signals and generates the at least one control bit responsive to the two signals.

Objects, advantages, additional aspects and other forms of the invention will become apparent upon reading the following detailed description and upon reference to the accompanying drawings.

DETAILED DESCRIPTION OF A PREFERRED EMBODIMENT

The claims at the end of this application set out novel features which applicants believe are characteristic of the invention. The invention, a preferred mode of use, further objectives and advantages, will best be understood by reference to the following detailed description of an illustrative embodiment read in conjunction with the accompanying drawings.

When chips are fabricated, some of the chips come out of the fabrication process as intended, while some are a little worse and others are a little better. For example, the widths of conductors or transistor channels may vary from chip to chip, which will affect the maximum clock frequency at which the chips can operate. Thus, a chip's performance is greatly influenced by the chip's processing history, i.e., "process point." Consequently, the chip's process point may be inferred from its operating performance.

To deal with manufacturing variability, design assumptions are made about chip operating extremes versus intended operation ("nominal" operation). Also, finished chips may be characterized as to where their operation falls within the operating extremes. A chip's performance is also greatly influenced by its operating temperature, i.e., "temperature point," which may vary greatly. The operating temperature is determined by a number of factors, including factors external to the chip such as ambient temperature and the nature of any heat sinks in the presence of the chip. Operating temperature is also affected by the performance of the chip itself, including how much the chip is being used, what type of calculations it is performing, and the voltage and frequency at which it is operating.

Figure 1:
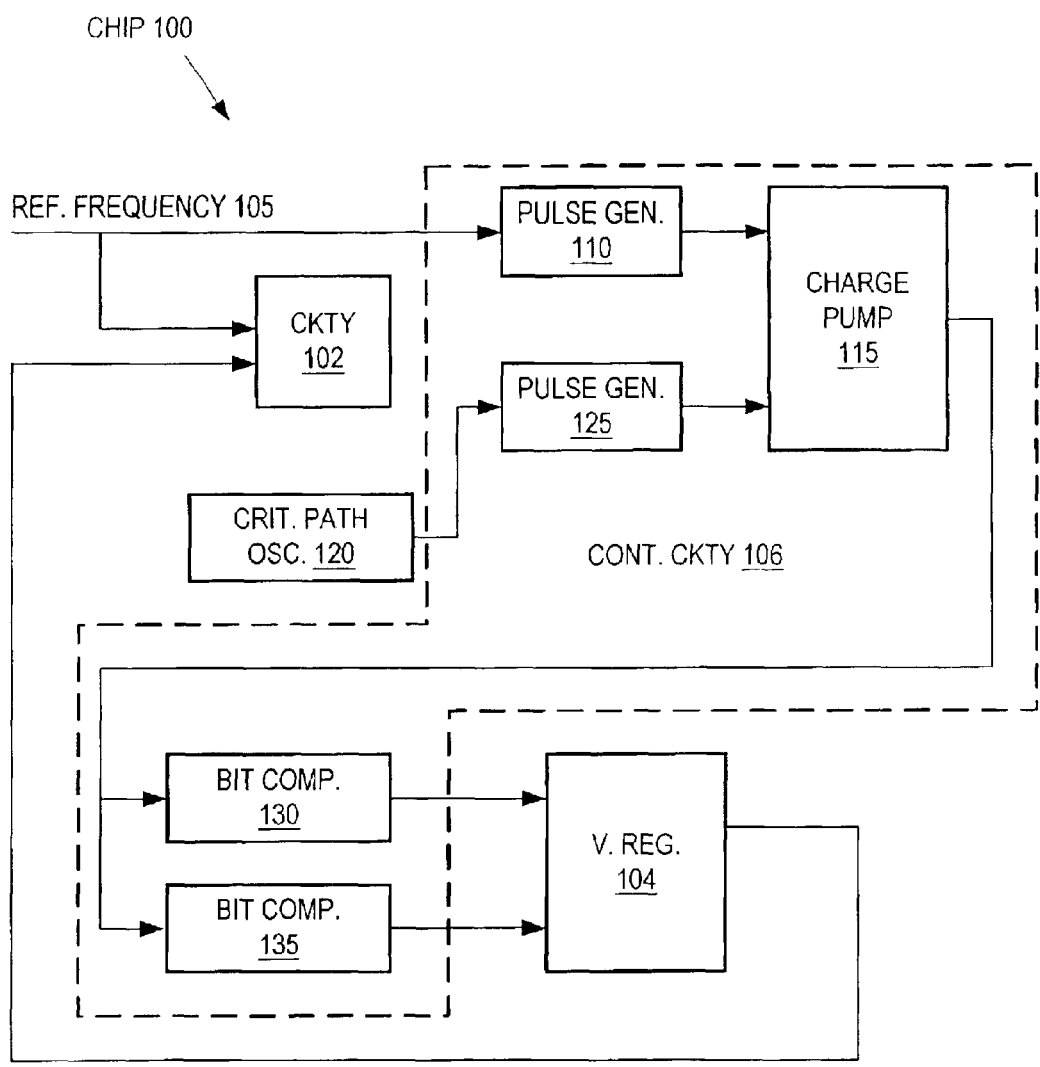
FIG. 1 illustrates aspects of an integrated circuit chip, according to an embodiment of the present invention.

Referring now to FIG. 1, an integrated circuit chip 100 is shown. In the embodiment illustrated, the chip 100 includes processor core, memory, bus controller, input/output controller, serial or parallel interface circuits, custom logic, and display controller integrated circuitry subsystems, as in a typical SOC. As representative of one such subsystem, FIG. 1 shows circuitry 102, which performs a processing function. The term "processing function" herein is used quite broadly to include functions of whatever type are conventionally performed by a particular subsystem, e.g., calculations performed by a processor, memory accesses performed by a memory subsystem, bus arbitration performed by a bus controller, polling of input/output devices performed by an input/output controller, graphic rendering performed by a display controller, etc.

The chip 100 also includes a bit-programmable voltage regulator 104. Takuma, U.S. Pat. No. 4,810,948, Constant-voltage regulated power supply circuit, Mar. 7, 1989, shows an appropriate bit-programmable voltage regulator and is hereby incorporated herein by reference.

The chip 100 receives an external time-based signal, shown here as reference frequency 105. In the embodiment, the reference frequency 105 includes a clock signal for the processor core or other core in the SOC, which is transmitted to the circuitry 102 on a system bus (not shown).

The chip 100 also has a "critical path" oscillator 120 for providing an indication of the performance of the circuitry 102, which as described above is influenced by the chip's process and temperature points. That is, the oscillator 120 generates a performance characterizing signal that varies in frequency in correspondence with the performance of the first circuitry. For example, if the chip 100 is operating above its specified temperature then the chip 100, including circuitry 102, will tend to operate at a lower frequency, which will be reflected also in the operating frequency of the oscillator 120 output signal. It is assumed that the external reference frequency 105 is quite stable with respect to process and temperature, at least in comparison with the other frequencies described herein.

Figure 2A:
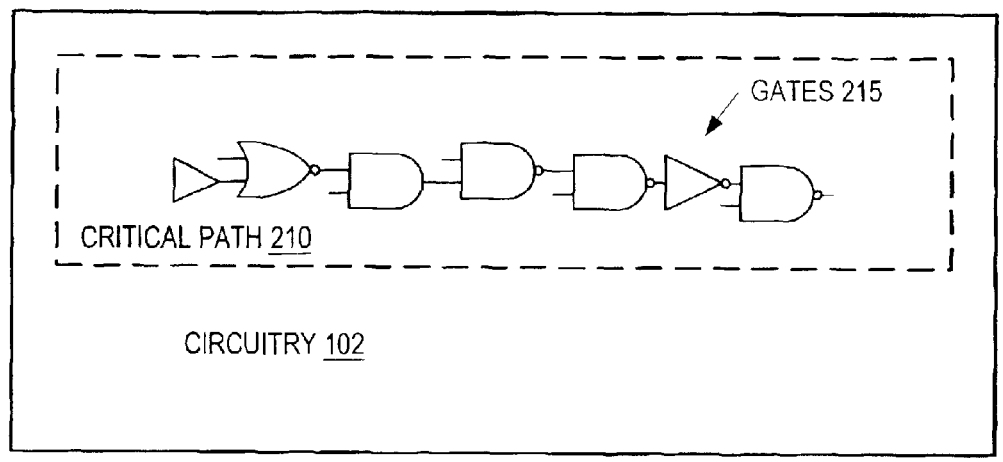
FIG. 2A illustrates details of a circuitry portion of the chip of FIG. 1, according to an embodiment of the present invention.
Figure 2B:
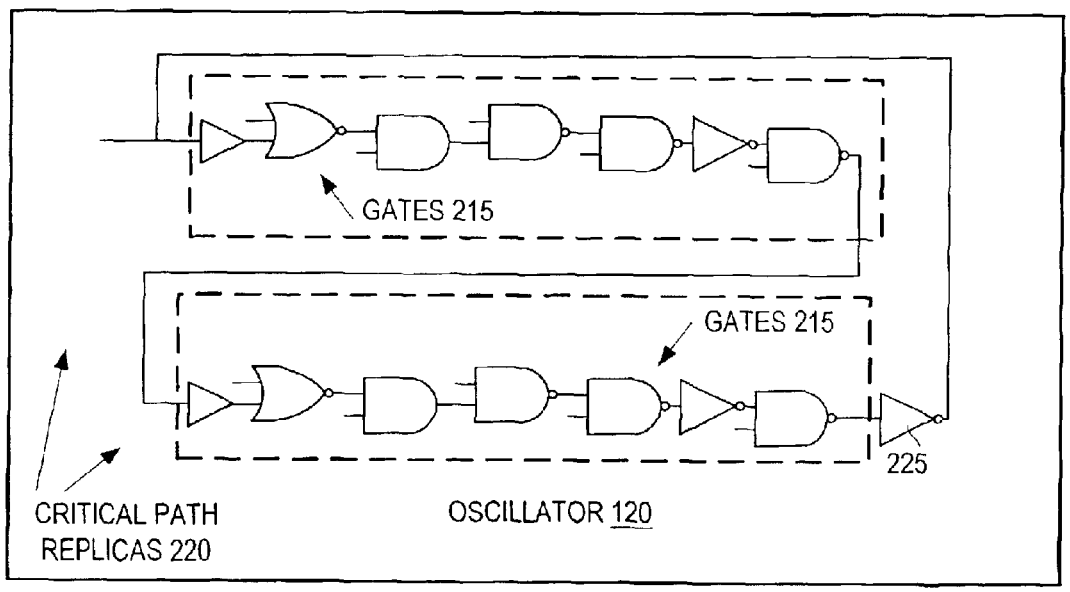
FIG. 2B illustrates details of an oscillator of the chip of FIG. 1, according to an embodiment.

Additional details of FIG. 1 will be described, but first refer to FIGS. 2A and 2B, in which details are illustrated for the circuitry 102 and the oscillator 120, respectively. According to the embodiment, the oscillator 120 output signal is designed to operate at the nominal operating frequency of the chip 100 (FIG. 1). The oscillator 120 is referred to as a "critical path" oscillator because integrated circuitry on the chip 100 has one or more series of logic gates 215 which define a longest latency, and therefore critical path 210, for propagation of signals. Variation in oscillator 120 output signal frequency is designed to closely track variation in propagation time through this critical path 210. As described above, this variation may arise due to process or temperature points. According to the embodiment, this is done by including in the oscillator 120 one or more critical path replicas 220 that include the same gates 215 as in critical path 210, which consequently reproduce the critical path 210 latency. (If necessary an inverter 225 may be added, as shown in FIG. 2B, in order to ensure the proper number of inversions for oscillation.) Thus, the oscillator 120 output signal provides an indication of circuitry 102 performance, including the circuitry 102 maximum operating frequency.

Note that according to the embodiment the oscillator 120 operates concurrently with the circuitry 102 so that the control circuitry 106 is operable to continuously monitor the indication of performance of the circuitry 102 while the circuitry 102 is in service, and is operable to dynamically, i.e., in real time, control the regulator 104 output voltage.

Also note that while the reference frequency 105 provided to chip 100 may be known even in advance of designing the chip 100, nevertheless the reference frequency 105 may be fixed by concerns independent of the chip 100 design. If reference frequency 105 is known in advance, then the critical path oscillator 120 may be designed to more precisely reflect the latency of the chip 100 critical path for the given reference frequency 105. In view of the given frequency 105, adjustments can be made in the design of oscillator 120, such as adding or subtracting inverters (while maintaining polarity), adding or subtracting copies of the critical path 210, and proportionally adjust all the gate sizes in the critical path replica simultaneously.

Referring again to FIG. 1, the reference frequency 105 and the critical path oscillator 120 output signal are input to first and second inputs of control circuitry 106, and the circuitry 106 responsively generates two output bits for controlling the voltage output by the bit-programmable voltage regulator 104 to the circuitry 102 and optionally to the control circuitry 106. If the critical path oscillator 120 output signal frequency exceeds that of the reference frequency 105 this indicates that the chip 100 maximum operating frequency is at or above its intended nominal frequency. In response, the control circuitry 106 output is "00," i.e., both output bits are low, which sets the regulator 104 output voltage to a first predetermined voltage level. If the chip 100 maximum operating frequency is a little bit below its nominal frequency then the output of control circuitry 106 is responsively driven to "01," i.e., one of the two output bits goes high, which raises the regulator 104 output voltage to a second predetermined voltage level, somewhat above the first voltage level. If the chip 100 maximum operating frequency drops even lower below its nominal operating frequency then the output of control circuitry 106 is responsively driven to "11," i.e., both of the two output bits go high, which raises the regulator 104 output voltage to a third predetermined voltage level, even higher above the first voltage level.

According to the present embodiment, control circuitry 106 includes first and second pulse generators 110 and 125. The reference frequency 105 is input to the first pulse generator 110. While the width of individual pulses output by pulse generator 110 remains essentially constant, the frequency of the output pulses increases and decreases in direct proportion to the frequency of the reference frequency 105. The output signal of the critical path oscillator 120 is input to the second pulse generator 125. Like the first pulse generator, the width of individual pulses output by pulse generator 125 remains essentially constant and the frequency of the output pulses output increases and decreases in direct proportion to the frequency of the input signal to the pulse generator 125, which in this case is the critical path oscillator 120 output signal. Kobayashi, U.S. Pat. No. 4,757, 214, Pulse generator circuit, Jul. 12, 1988, shows an appropriate pulse generator and is hereby incorporated herein by reference.

According to the present embodiment, control circuitry 106 also includes charge pump 115 which includes two input nodes. First pulse generator 110 outputs pulses to the first input of charge pump 115 while the second pulse generator 125 outputs pulses to the second input of the charge pump 115. The voltage output by charge pump 115 increases or decreases in direct proportion to the difference between the pulse rates of the signals received from the respective pulse generators 110 and 125. That is, if pulse generator 110 outputs pulses at a higher frequency than pulse generator 125 then the charge pump 115 will increase the charge it pumps out and consequently voltage on the charge pump 115 output node will increase, and if pulse generator 110 outputs pulses at a lower frequency than pulse generator 125 then the charge pump 115 will decrease the charge it pumps out and consequently voltage on the charge pump 115 output node will decrease. Thus, if the maximum operating frequency of the chip 100 is lower than the intended frequency then the charge pump 115 output voltage will increase, and if the maximum operating frequency of the chip 100 is better than nominal, then the charge pump 115 output voltage will decrease. Kawasumi, U.S. Pat. No. 6,415,007, Charge pump having two sub charge pumps which include a common charge/discharge terminal, Jul. 2, 2002, shows an appropriate charge pump and is hereby incorporated herein by reference.

According to the present embodiment, control circuitry 106 also includes two bit comparators 130 and 135 which drive the previously mentioned output bits of control circuitry 106. The charge pump 115 output node coupled is to the inputs of the bit comparators 130 and 135. The bit comparators 130 and 135 drive their output voltages high responsive to their input voltages increasing above certain predetermined threshold levels. The bit comparators 130 and 135 are designed to trigger their respective outputs at different threshold levels. That is, the output voltage of bit comparator 130 is driven high for a lower input voltage than bit comparator 135. Thus, if the chip 100 maximum operating frequency is above its intended nominal frequency the output of both bit comparators 130 and 135 will be 0. If the chip 100 maximum operating frequency is a little bit below its nominal frequency then the output of bit comparator 130 will go high. If the chip 100 maximum operating frequency drops even lower below its nominal operating frequency then the output of bit comparator 135 will also go high so that both bit comparator 130 and 135 outputs will be high.

Figure 3A:
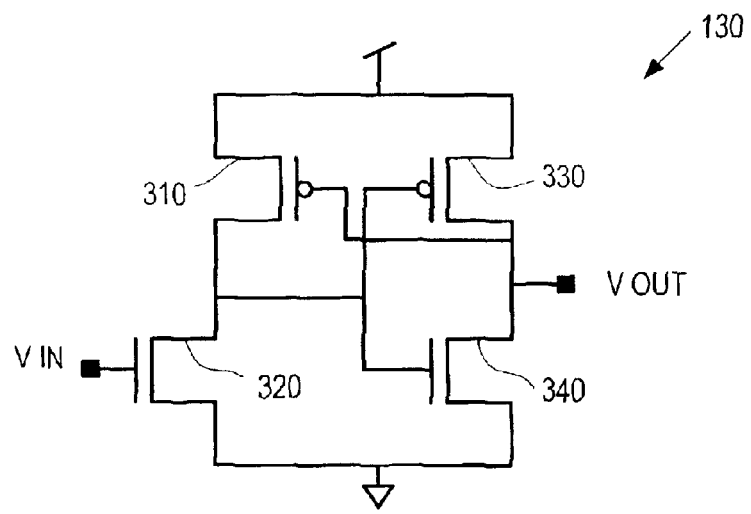
FIG. 3A illustrates a bit comparator of the chip of FIG. 1, according to an embodiment.

Referring now to FIG. 3A, circuitry suitable for bit comparator 130 is shown, according to an embodiment. (The circuitry is also suitable for bit comparator 135.) Bit comparator 130 receives a voltage input signal on the gate electrode of an NFET 320. One of the NFET 320 conducting electrodes is connected to ground and the other is connected to one of the conducting electrodes of a PFET 310. The other conducting electrode of PFET 310 is connected to an externally supplied voltage or optionally to the regulated voltage supply which is output by on-chip voltage regulator 104.

The bit comparator 130 also has conducting electrodes of another pair of PFET 330 and NFET 340 connected in series between the voltage supply and ground. Their common conducting electrode provides the voltage output node for the comparator 130. The gate electrode of PFET 310 is also connected to the voltage output node for the comparator 130. The common conducting electrode of the series connected PFET 310 and NFET 320 is connected to the gate electrodes of PFET 330 and NFET 340.

Figure 3B:
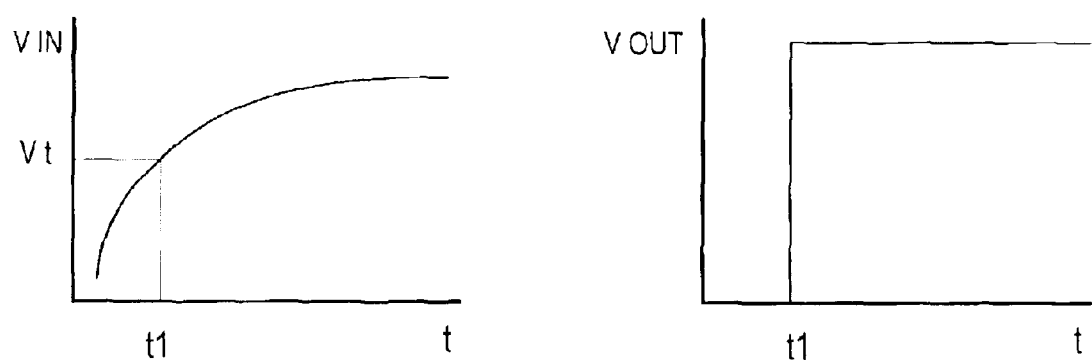
FIG. 3B illustrates a voltage input and a responsive voltage output of the bit comparator of FIG. 3A.

Referring now to FIG. 3B, the voltage output response of bit comparator 130 is illustrated for a time varying input voltage. If the charge pump 115 output increases the input voltage to bit comparator 130 above a predetermined threshold voltage Vt at time t1, as shown on the left in FIG. 3B, this turns on NFET 320, which pulls down the gate electrode voltages to PFET 330 and NFET 340, turning on PFET 330 and turning off NFET 340. This in turn abruptly pulls up the voltage on the voltage output node through the conducting electrodes of PFET 330, as shown on the right in FIG. 3B. (The output voltage shown, Vout, is of course shown in idealized fashion. It should be understood that while Vout is more nearly a step response than Vin, nevertheless, Vout is not an ideal step voltage.) Pulling up the voltage on the voltage output node in turn switches off PFET 310, which is consistent with the grounding of the common conducting electrode of PFET 310 and NFET 320. It should be appreciated from the above that bit comparator 130 advantageously provides a clean, abruptly switching binary output signal responsive to the gradual accumulation of charge on the bit comparator 130 input driven by charge pump 115. While not explicitly illustrated here, it should also be appreciated that this process also works in reverse. That is, bit comparator 130 advantageously provides a clean binary output signal that switches to zero responsive to Vin falling below Vt.

Figure 4:
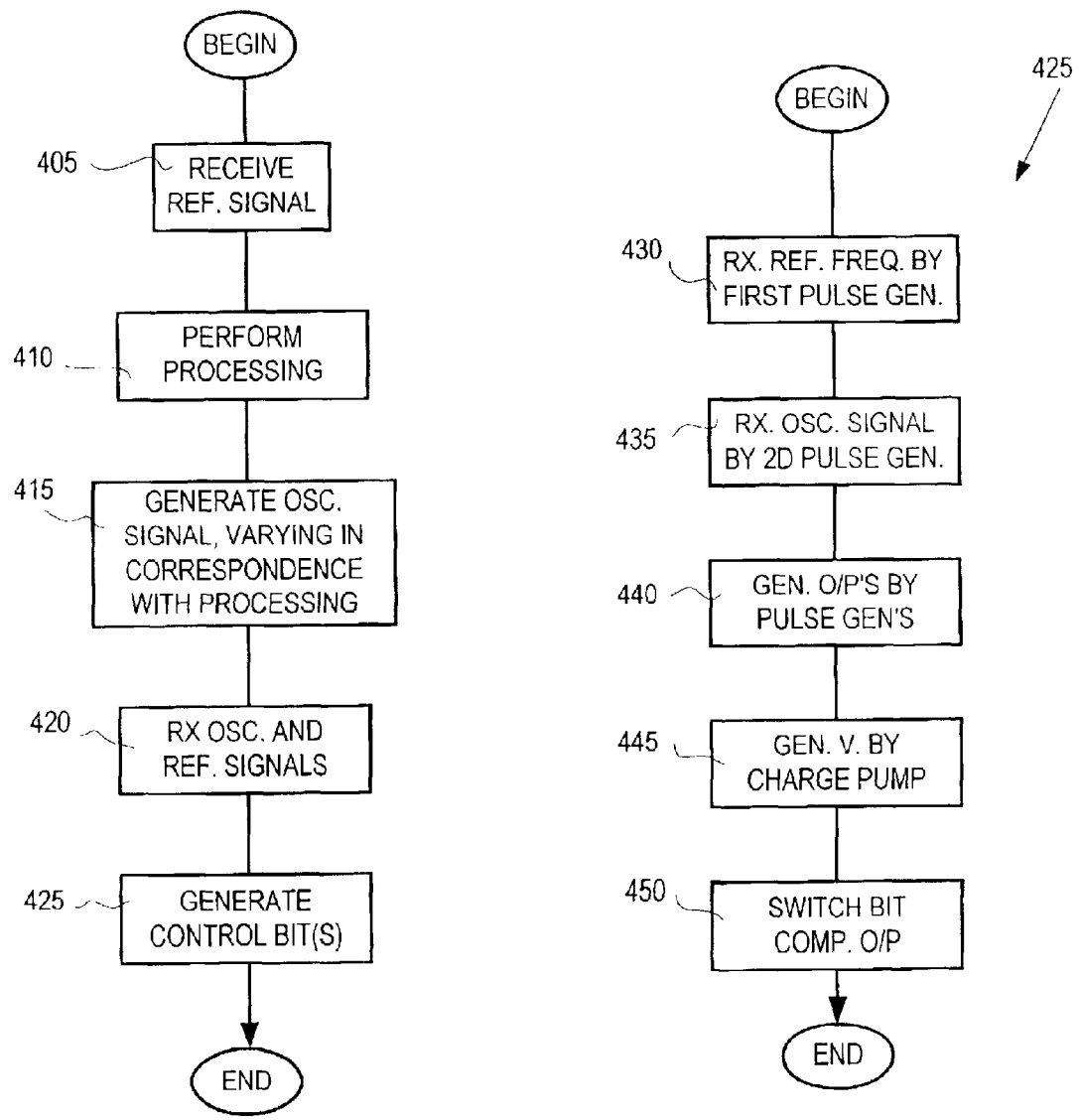
FIG. 4 illustrates logical aspects of the invention in a flow chart format, according to an embodiment.

Referring now to FIG. 4, logical aspects of controlling an on-chip, bit-programmable voltage regulator for integrated circuitry on a single chip are illustrated, according to an embodiment. It should be understood that the actions in the flow chart do not necessarily have to be performed in the particular sequence in which they are set out.

In logic block 405 an externally generated, time-based reference signal is received by the integrated circuitry. In logic block 410 a processing function is performed by circuitry on the chip. In logic block 415 a time-based, oscillator output signal is generated by an oscillator on the chip. The oscillator output signal varies in correspondence with performance of the circuitry. In logic block 420 the reference and oscillator output signals are received by control circuitry on the chip. In logic block 425 by the control circuitry generates at least one control bit, responsive to the two signals, for controlling the regulator output voltage.

Details of logic block 425 are illustrated in additional logic blocks as shown, according to an embodiment. In logic block 430, the reference frequency is received as an input signal by a first pulse generator. In logic block 435, the oscillator output signal is received as an input signal by a second pulse generator. In logic block 440, the pulse generators generate respective output pulses of essentially constant pulse width and which increase and decrease in frequency responsive to increasing and decreasing frequency of the respective pulse generator input signals. In logic block 445, voltage on a charge pump output node increases responsive to the frequency of pulses output by the first pulse generator exceeding the frequency of pulses output by the second pulse generator and decreases responsive to the frequency of pulses output by the second pulse generator exceeding the frequency of pulses output by the first pulse generator. In logic block 450, an output bit of a bit comparator switches to a high voltage level responsive to the charge pump output voltage exceeding a threshold voltage and switches to a low voltage level responsive to the charge pump output voltage falling below the threshold voltage.

It should be appreciated from the above that the invention permits designing integrated circuits based on more demanding performance limits, or else permits a design with a smaller chip area and corresponding lower power consumption in order to satisfy the same performance requirements as would otherwise be required for a design without advantageous features of the invention. In other words, since the invention enables automatically raising operating voltage to integrated circuitry responsive to an indication of the circuitry's performance, for a given transistor gate size the circuitry design can tolerate greater variability in the fabrication process and in operating temperature while still satisfying performance constraints.

It should also be understood the present invention is advantageous because of its simplicity of design, which can be fully implemented in standard integrated CMOS technology. Furthermore, the invention is advantageous because it can deal with circuits having a wide range of operating frequencies. This flexibility is due to the fact that parameters can be changed to adjust to a given frequency. These parameters include a) frequency of the oscillator 120, b) pulse width of the pulse generators 110 and 125, and c) switching level of the output bit comparators 130 and 135.

In the embodiment described, circuitry 102 has been described as a processor core. However, it should be understood, as previously stated, that it is intended that the circuitry 102 may encompass numerous other alternatives. These alternatives include serial or parallel communication links, arithmetic units, signal processing engines, and custom logic. Likewise, the reference frequency 105 has been described as a clock signal for the processor core. It should be understood that it is intended that the reference frequency may encompass numerous other alternatives, including the sampling clock signal for a communication link, or a system reference clock.

It should also be understood that the presented invention should not be limited to sensing a critical path latency by an oscillator in order to characterize IC chip performance in terms of maximum operating frequency for the chip. The sensing can be by other means and furthermore the sensing can characterize chip performance in terms of other parameters besides operating frequency, and can even characterize performance of an input signal or device providing an input signal to the chip. For example, for a pressure analysis system embodiment, a voltage-controlled oscillator senses voltage produced by a pressure transducer output signal and the oscillator modulates its output signal amplitude responsively. Assuming an automatic gain control input, a larger pressure transducer output signal amplitude means a better pressure transducer, and thus a lower supply voltage will suffice for circuits on the pressure analysis system's IC chip. In this embodiment the larger pressure transducer output signal amplitude is transformed into a higher oscillator frequency and in turn into a lower regulated supply voltage.

The presented invention also encompasses other types of on-chip parameters being sensed, such as signal amplitude degradation. For example, in the case of a large chip, the sensor can be placed near the input of a small analog core. In one embodiment the sensor includes a voltage-controlled oscillator whose supply amplitude is given by the amplitude of a signal received by the core. A larger amplitude means a less degraded input signal, and thus a lower voltage supply will suffice for the internal amplifier circuits. Consequently, control circuitry transforms the larger amplitude into a higher oscillation frequency and, in turn, a lower regulated supply.

It should also be appreciated that while the embodiment illustrated provides two bits output by respective bit comparators, the number of bit comparators may be increased or decreased to increase or decrease resolution of voltage regulation.

To reiterate, the embodiment or embodiments presented herein were chosen and described in order to best explain the principles of the invention, the practical application, and to enable others of ordinary skill in the art to understand the invention. Various other embodiments having various modifications may be suited to a particular use contemplated, but may be within the scope of the present invention. Moreover, it should be understood that the actions in the following claims do not necessarily have to be performed in the particular sequence in which they are set out.

What is claimed is:

1. An apparatus, including integrated circuitry on a single chip, wherein the integrated circuitry comprises:
   a bit-programmable voltage regulator on the chip operable to supply voltage to first circuitry on the chip;
   second cirvuiuy on the chip operable for characterizing frequency nerformance of the first circuitry; and
   control circuitry on the chip operable, responsive to the characterizing performed by the second circuitry, to output at least one digital control bit for controlling the regulator output voltage supplying the first circuitry.

2. An apparatus, including integrated circuitry on a single chip, wherein the integrated circuitry comprise:
   a bit-programmable voltage regulator on the chip operable to supply voltage to first circuitry on the chip;
   second circuitry on the chic operable for characterizing performance of the first circuitry;
   control circuitry on the chip operable, responsive to the characterizing performed by the second circuitry, to output at least one digital control bit for controlling the regulator output voltage supplying the first circuitry, wherein the characterized performance includes maximum operating frequency of the first circuitry, the first circuitry includes critical path circuitry influencing the maximum operating frequency, and the second circuitry characterizes the first circuitry's maximum operating frequency circuitry responsive to reproducing a propagation delay of the critical path circuitry.

3. An apparatus, including integrated circuitry on a single chin wherein the integrated circuitry comprises:
   a bit-programmable voltage regulator on the chin operable to supply voltage to first circuitry on the chip; second circuitry on the chip operable for characterizing performance of the first circuitry; and
   control circuitry on the chip operable, responsive to the characterizing performed by the second circuitry to output at least one digital control bit for controlling the regulator output voltage supplying the first circuitry, wherein the integrated circuitry is operable to receive an externally generated, time-based reference signal, and the second circuitry comprises:
      an on-chip oscillator operable to generate a time-based, oscillator output signal that varies in frequency in correspondence with performance variation of the first circuitry, wherein the control circuitry receives the reference and oscillator output signals and generates the at least one control bit responsive to the two signals.

4. The apparatus of claim 1, wherein the second circuitry operates concurrently with the first circuitry so that the control circuitry is operable to i) continuously monitor the characterized performance of the first circuitry while the first circuitry is in service and ii) dynamically control the regulator output voltage.

5. The apparatus of claim 3, wherein the characterized performance includes maximum operating frequency of the first circuitry, the first circuitry includes critical path circuitry that influences the maximum operating frequency, the oscillator includes circuitry that reproduces a propagation delay of the critical path circuitry, and the propagation delay influences the frequency of the oscillator output signal.

6. The apparatus of claim 3, wherein the control circuitry comprise:
   first pulse generator for receiving the reference frequency; and
   second pulse generator for receiving the oscillator output signal, wherein the pulse generators generate respective output pulses that change in frequency responsive to a change in frequency of their respective input signals.

7. The apparatus of claim 6, wherein the control circuitry comprises:

a charge pump having first and second input nodes coupled to the output of the respective first and second pulse generators, wherein the charge pump changes voltage on a charge pump output node responsive to a difference in the frequency of pulses output by the first pulse generator and the frequency of pulses output by the second pulse generator.

8. The apparatus of claim 7, wherein the control circuitry comprises:
a bit comparator having an input node coupled to the output node of the charge pump and an output node coupled to an input node of the voltage regulator, wherein the bit comparator switches an output bit responsive to the charge pump output voltage.

9. An apparatus including integrated circuitry on a single chip, wherein the integrated circuitry comprises:
a bit-programmable voltage regulator on the chip operable to supply voltage to first circuitry on the chip;
second circuitry on the chip operable for characterizing performance of the first circuitry; and
control circuitry on the chip operable responsive to the characterizing performed by the second circuitry, to output at least one digital control bit for controlling the regulator output voltage supplying the first circuitry, wherein the second circuitry generates a performance characterizing signal that varies in correspondence with performance variation of the first circuitry, and wherein the control circuitry comprises:
a charge pump for generating a voltage on an output node of the charge pump responsive to the performance characterization signal, and
a bit comparator having an input node coupled to an output node of the charge pump and a bit comparator output node coupled to an input node of the voltage regulator for providing the at least one digital control bit for controlling the regulator output voltage, wherein the bit comparator switches a bit on the bit comparator output node responsive to the charge pump output voltage.

10. The apparatus of claim 9, wherein the charge pump has first and second input nodes, the first charge pump input node being operable to receive a signal derived from a reference signal and the second charge pump input node being operable to receive a signal derived from the performance characterizing signal, and wherein the charge pump changes voltage on the charge pump output node responsive to the signals received an the first and second charge pump input nodes.

11. The apparatus of claim 10, comprising:
first pulse generator for receiving the reference signal; and
second pulse generator for receiving the performance characterizing signal, wherein the pulse generators generate respective output pulses that change in frequency responsive to a change in frequency of their respective input signals.

12. The apparatus of claim 11, wherein the reference signal received by the first pulse generator is an externally generated, time-based reference signal, and the second circuitry comprises:
an on-chip oscillator for generating a time-based, oscillator output signal that provides the performance characterizing signal.

13. An apparatus, including integrated circuitry on a single chip, wherein the integrated circuitry is operable to receive an externally generated, time-based reference signal, and the integrated circuitry comprises:

a bit-programmable voltage regulator on the chip operable to supply voltage to first circuitry on the chip;
an on-chip oscillator, the oscillator including circuitry that reproduces a propagation delay of critical path circuitry of the first circuitry for generating a performance characterizing signal that varies in frequency in correspondence with performance of the first circuitry;
control circuitry, wherein the oscillator operates concurrently with the first circuitry so that the control circuitry is operable to i) continuously monitor the performance characterizing signal while the first circuitry is in service and ii) dynamically control the regulator output voltage, wherein the control circuitry comprises:
first pulse generator for receiving a reference signal;
second pulse generator for receiving the performance characterizing signal, wherein the pulse generators generate respective output pulses that change in frequency responsive to a change in frequency of their respective input signals;
a charge pump having first and second input nodes coupled to the output of the respective first and second pulse generators, wherein the charge pump changes voltage on a charge pump output node responsive to a difference in the frequency of pulses output by the first pulse generator and the frequency of pulses output by the second pulse generator; and
a bit comparator having an input node coupled to the output node of the charge pump and an output node coupled to an input node of the voltage regulator, wherein the bit comparator switches an output bit responsive to the charge pump output voltage.

14. A method of controlling an on-chip, bit-programmable voltage regulator for integrated circuitry on a single chip, the method comprising the steps of:
receiving, by the integrated circuitry, an externally generated, time-based reference signal;
generating a frequency performance characterizing signal by air oscillator on the chip, wherein the frequency performance characterizing signal varies in frequency in correspondence with frequency performance of first circuitry on the chip; and
receiving the reference and oscillator output signals by control circuitry on the chip and generating, by the control circuitry, at least one control bit responsive to the two signals, for controlling an output voltage of the voltage regulator, wherein the output voltage of the voltage regulator supplies voltage to the first circuitry.

15. A method of controlling an on-chip, bit-programmable voltage regulator for integrated circuitry on a single chin, the method comprising the steps of:
receiving, by the integrated circuitry, an externally generated, time-based reference signal;
generating a performance characterizing signal by an oscillator on the chip, wherein the performance characterizing signal varies in frequency in correspondence with performance of first circuitry on the chip; and
receiving the reference and oscillator output signals by control circuitry on the chip and generating, by the control circuitry, at least one control bit responsive to the two signals, for controlling an output voltage of the voltage to the first circuitry, wherein generating the at least one control bit by the control circuitry comprises the steps of:
receiving the reference frequency as an input signal by a first pulse generator;
receiving the oscillator output signal by a second pulse generator; and generating, by the pulse generators, respective output pulses the change in frequency responsive to a change in frequency of the respective pulse generator input signals.

16. The method of claim 15, wherein generating the at least one control bit by the control circuitry comprises the steps of:

changing voltage on a charge pump output node responsive to a difference in the frequency of pulses output by the first pulse generator and the frequency of pulses output by the second pulse generator.

17. The method of claim 16, wherein generating the at least one control bit by the control circuitry comprises the steps of:

switching an output bit of a bit comparator responsive to the charge pump output voltage.

18. The method of claim 14, wherein the oscillator operates concurrently with the first circuitry so that the control circuitry is operable to i) continuously monitor the performance characterizing signal while the first circuitry is in service and ii) dynamically control the regulator output voltage.

19. An apparatus, including integrated circuitry on a single chip, wherein the integrated circuitry comprises:

a bit-programmable voltage regulator on the chip operable to supply voltage to first circuitry on the chip;

second circuitry on the chip operable for characterizing degradation of an input signal received by the first circuitry; and control circuitry on the chip operable, responsive to the characterizing performed by the second circuitry, to output at least one digital control bit for controlling the regulator output voltage supplying the first circuitry.

20. A method of controlling an on-chip, bit-programmable voltage regulator for integrated circuitry on a single chip, the method comprising the steps of:

receiving, by the integrated circuitry, an externally generated, time-based reference signal;

generating, by an oscillator on the cup, a characterizing signal, wherein the characterizing signal varies in frequency in correspondence with degradation of an input signal received by first circuitry on the chip; and receiving the reference and characterizing signals by control circuitry on the chip and generating, by the control circuitry, at least one control bit responsive to the two signals, for controlling an output voltage of the voltage regulator, wherein the output voltage of the voltage regulator supplies voltage to the first circuitry.

* * * * *

UNITED STATES PATENT AND TRADEMARK OFFICE
CERTIFICATE OF CORRECTION

PATENT NO. : 6,801,025 B2
DATED : October 5, 2004
INVENTOR(S) : Carballo et al.

It is certified that error appears in the above-identified patent and that said Letters Patent is hereby corrected as shown below:

Column 8,
Line 1, please delete "cirvuiuy" and replace it with -- circuitry --;
Line 2, please delete "nerformance" and replace it with -- performance --;
Line 26, please delete "chin" and replace it with -- chip --;

Column 10,
Line 61, after "voltage" please insert -- regulator, wherein the output voltage of the voltage regulator supplies voltage --.

Signed and Sealed this

Fifteenth Day of February, 2005

JON W. DUDAS
*Director of the United States Patent and Trademark Office*